United States Patent
Hirata

(10) Patent No.: US 9,868,177 B2
(45) Date of Patent: Jan. 16, 2018

(54) WAFER PRODUCING METHOD

(71) Applicant: DISCO CORPORATION, Tokyo (JP)

(72) Inventor: Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/472,945

(22) Filed: Mar. 29, 2017

(65) Prior Publication Data

US 2017/0291254 A1   Oct. 12, 2017

(30) Foreign Application Priority Data

Apr. 6, 2016   (JP) ................ 2016-076734

(51) Int. Cl.
| | | |
|---|---|---|
| *H01L 29/16* | (2006.01) | |
| *B23K 26/00* | (2014.01) | |
| *B28D 5/00* | (2006.01) | |
| *B23K 26/53* | (2014.01) | |
| *B23K 26/082* | (2014.01) | |
| *B23K 103/00* | (2006.01) | |

(52) U.S. Cl.
CPC ...... *B23K 26/0057* (2013.01); *B23K 26/0006* (2013.01); *B23K 26/082* (2015.10); *B23K 26/53* (2015.10); *B28D 5/0011* (2013.01); *H01L 29/1608* (2013.01); *B23K 2203/56* (2015.10)

(58) Field of Classification Search
CPC .... H01L 21/30; H01L 21/322; B23K 26/0057
See application file for complete search history.

(56) References Cited

U.S. PATENT DOCUMENTS

2016/0158881 A1*   6/2016   Hirata ................ B23K 26/0057
225/2

FOREIGN PATENT DOCUMENTS

| JP | 2000-94221 | 4/2000 |
|---|---|---|
| JP | 2013-49161 | 3/2013 |

* cited by examiner

*Primary Examiner* — Seahvosh Nikmanesh
(74) *Attorney, Agent, or Firm* — Greer Burns & Crain Ltd.

(57) ABSTRACT

An SiC wafer is produced from an SiC ingot by a method that includes a first modified layer forming step and a second modified layer forming step. In the first step, a first laser beam having a first power forms a plurality of discrete first modified layers at a first depth inside the ingot. In the second step, a second laser beam having a second power greater than the first power is applied to the ingot with the second laser beam focused at a depth greater than the first depth. A beam spot of the second laser beam overlaps any one of the plural first modified layers, thereby continuously forming a plurality of second modified layers connected in a line at the first depth. Cracks are formed on both sides of the line of the plural second modified layers so as to extend along a c-plane in the ingot.

1 Claim, 9 Drawing Sheets

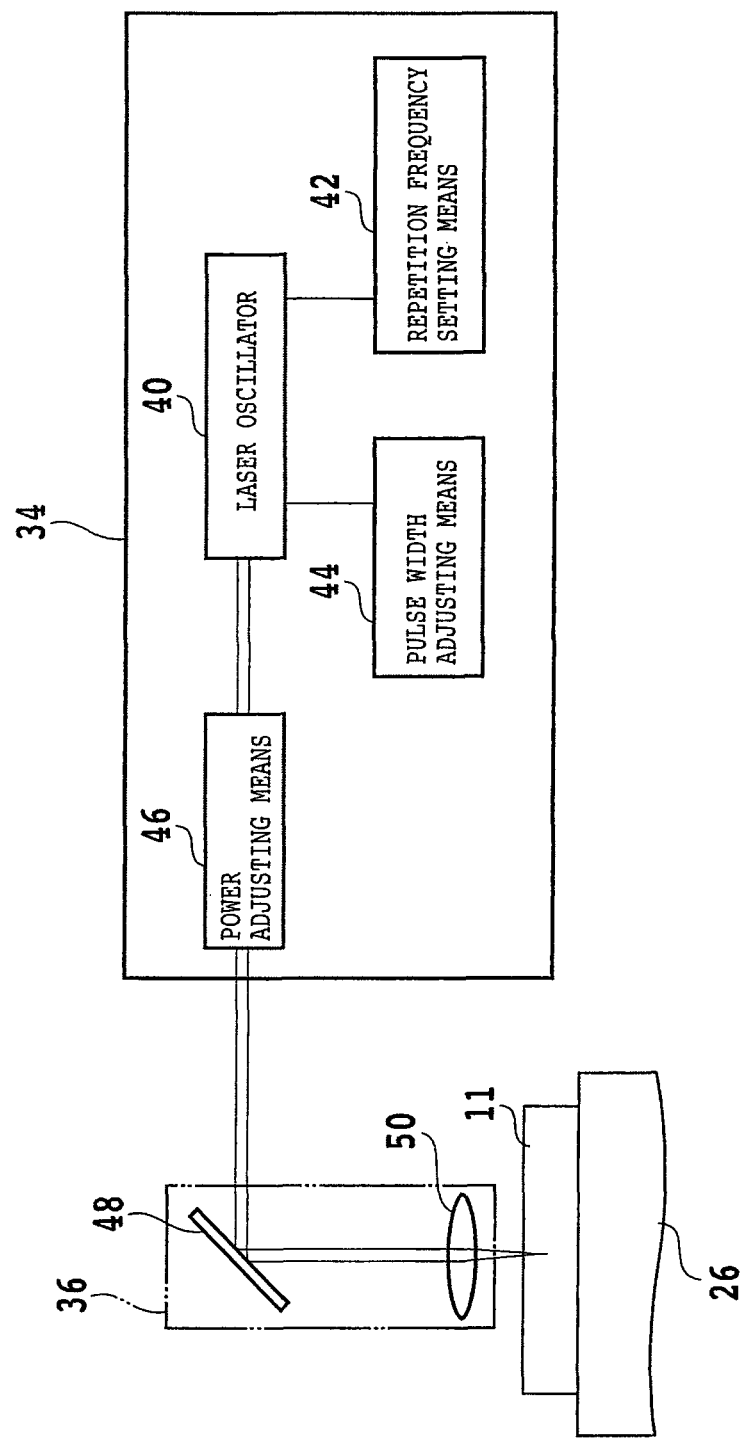

WAFER PRODUCING METHOD

BACKGROUND OF THE INVENTION

Field of the Invention

The present invention relates to a wafer producing method for slicing a silicon carbide (SiC) ingot to produce a wafer.

Description of the Related Art

Various devices such as integrated circuits (ICs) and large-scale integrations (LSIs) are formed by forming a functional layer on the front side of a wafer formed of silicon or the like and partitioning this functional layer into a plurality of regions along a plurality of crossing division lines. The division lines of the wafer are processed by a processing apparatus such as a cutting apparatus and a laser processing apparatus to thereby divide the wafer into a plurality of individual device chips corresponding to the respective devices. The device chips thus obtained are widely used in various equipment such as mobile phones and personal computers. Further, power devices or optical devices such as light emitting diodes (LEDs) and laser diodes (LDs) are formed by forming a functional layer on the front side of a wafer formed of a hexagonal single crystal such as SiC and GaN and partitioning this functional layer into a plurality of regions along a plurality of crossing division lines.

In general, the wafer on which the devices are to be formed is produced by slicing an ingot with a wire saw. Both sides of the wafer obtained above are polished to a mirror finish (see Japanese Patent Laid-open No. 2000-94221, for example). This wire saw is configured in such a manner that a single wire such as a piano wire having a diameter of about 100 to 300 µm is wound around many grooves formed on usually two to four guide rollers to form a plurality of cutting portions spaced in parallel with a given pitch. The wire is operated to run in one direction or opposite directions, thereby slicing the ingot into a plurality of wafers.

However, when the ingot is cut by the wire saw and both sides of each wafer are polished to obtain the product, 70% to 80% of the ingot is discarded to cause a problem of poor economy. In particular, an SiC ingot has high Mohs hardness and it is therefore difficult to cut this ingot with the wire saw. Accordingly, considerable time is required for cutting of the ingot, causing a reduction in productivity. That is, there is a problem in efficiently producing a wafer in this prior art.

A technique for solving this problem is described in Japanese Patent Laid-open No. 2013-49161. This technique includes the steps of setting the focal point of a laser beam having a transmission wavelength to SiC inside an SiC ingot, next applying the laser beam to the ingot as scanning the laser beam on the ingot to thereby form a modified layer and cracks in a separation plane inside the ingot, and next applying an external force to the ingot to thereby break the ingot along the separation plane where the modified layer and the cracks are formed, thus separating a wafer from the ingot.

In this technique, the laser beam is scanned spirally or linearly along the separation plane so that a first application point of the laser beam and a second application point of the laser beam nearest to the first application point have a predetermined positional relation with each other. As a result, the modified layer and the cracks are formed at very high density in the separation plane of the ingot.

SUMMARY OF THE INVENTION

However, in the ingot cutting method described in Japanese Patent Laid-open No. 2013-49161 mentioned above, the laser beam is scanned spirally or linearly on the ingot. In the case of linearly scanning the laser beam, the direction of scanning of the laser beam is not specified. In the ingot cutting method described in Japanese Patent Laid-open No. 2013-49161, the pitch (spacing) between the first application point and the second application point of the laser beam as mentioned above is set to 1 to 10 µm. This pitch corresponds to the pitch of the cracks extending from the modified layer along a c-plane defined in the ingot.

In this manner, the pitch of the application points of the laser beam to be applied to the ingot is very small. Accordingly, regardless of whether the laser beam is scanned spirally or linearly, the laser beam must be applied with a very small pitch and the improvement in productivity is not yet sufficient.

It is therefore an object of the present invention to provide a wafer producing method which can efficiently produce a wafer from an ingot.

In accordance with an aspect of the present invention, there is provided a wafer producing method for producing an SiC wafer from an SiC ingot having a first surface, a second surface opposite to the first surface, a c-axis extending from the first surface to the second surface, and a c-plane perpendicular to the c-axis, the wafer producing method including a first modified layer forming step of setting the focal point of a first laser beam having a transmission wavelength to the SiC ingot and a first power, inside the SiC ingot at a first depth from the first surface, the first depth corresponding to the thickness of the SiC wafer to be produced, and next applying the first laser beam to the first surface as relatively moving the focal point of the first laser beam in a first direction perpendicular to a second direction where the c-axis is inclined by an off angle with respect to a normal to the first surface and the off angle is formed between the first surface and the c-plane, thereby discretely forming a plurality of first modified layers parallel to the first surface at the first depth, the first modified layers being spaced from each other in the first direction; a first indexing step of relatively moving the focal point of the first laser beam in the second direction to thereby index the focal point of the first laser beam by a predetermined amount; a second modified layer forming step of setting the focal point of a second laser beam having a transmission wavelength to the SiC ingot and a second power greater than the first power, inside the SiC ingot at a second depth greater than the first depth from the first surface in such a manner that a beam spot of the second laser beam overlaps any one of the first modified layers at the first depth, after performing the first modified layer forming step and the first indexing step, and next applying the second laser beam to the first surface as relatively moving the focal point of the second laser beam in the first direction, thereby continuously forming a plurality of second modified layers parallel to the first surface at the first depth, the second modified layers being overlapped with each other to form a straight line extending in the first direction, and also forming cracks on both sides of the straight line so as to extend along the c-plane; a second indexing step of relatively moving the focal point of the second laser beam in the second direction to thereby index the focal point of the second laser beam by the predetermined amount; and a wafer separating step of separating a plate-shaped member having a thickness corresponding to the thickness of the SiC wafer from the SiC ingot at a separation start point composed of the second modified layers and the cracks after performing the second modified layer forming step and the second indexing step, thus producing the SiC wafer from the SiC ingot.

According to the wafer producing method of the present invention, the first modified layers formed at the first depth function to start the occurrence of multiphoton absorption in applying the second laser beam to the ingot. Accordingly, the second modified layers are formed at the first depth from the first surface, and the cracks are formed on both sides of the line of the second modified layers so as to propagate along the c-plane. Accordingly, the plate-shaped member having a thickness corresponding to the thickness of the SiC wafer can be easily separated from the SiC ingot at the separation start point composed of the second modified layers and the cracks. Thus, the SiC wafer can be produced from the SiC ingot. Accordingly, the improvement in productivity can be made sufficient and the amount of the ingot to be discarded can be sufficiently reduced to approximately 30%.

The following fact has already been found by an experiment. In applying a laser beam having a transmission wavelength to an SiC ingot to thereby form a modified layer inside the ingot, the modified layer is formed as a region where SiC is separated into Si and C. The modified layer is first formed at the focal point of the laser beam. When the laser beam is next applied to the ingot, the laser beam is absorbed by C present in the modified layer to thereby next form another modified layer over the previous modified layer. This action is repeated to gradually raise the modified layer from the focal point. Finally, the modified layer is stably formed at a position where the power density defined as {average power/(spot area×repetition frequency)} becomes 1.13 J/mm².

In the wafer producing method of the present invention based on the above findings, the first modified layer forming step is first performed in the following manner. The focal point of the first laser beam having the first power is set at the first depth from the first surface of the ingot, wherein the first depth corresponds to the thickness of the wafer to be produced. In this condition, the first laser beam is applied to the first surface as relatively moving the focal point of the first laser beam in the first direction, thereby discretely forming the plural first modified layers parallel to the first surface at the first depth, wherein the first modified layers are spaced from each other in the first direction. Thereafter, the second modified layer forming step is performed in the following manner. The focal point of the second laser beam having the second power greater than the first power is set at the second depth greater than the first depth in such a manner that a beam spot of the second laser beam overlaps any one of the first modified layers at the first depth. That is, the focal point of the second laser beam is adjusted so that the power density of the beam spot of the second laser beam at the first depth becomes 1.13 J/mm². In this condition, the second laser beam is applied to the first surface as relatively moving the focal point of the second laser beam in the first direction.

As a result, the first modified layers function to start the occurrence of multiphoton absorption in applying the second laser beam to the ingot, and the plural second modified layers parallel to the first surface can be continuously formed at the first depth where the first modified layers have already been formed. Further, the cracks can be also formed so as to extend from the line of the second modified layers along the c-plane.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2 is a block diagram of a laser beam generating unit;

DETAILED DESCRIPTION OF THE PREFERRED EMBODIMENT

Figure 1:
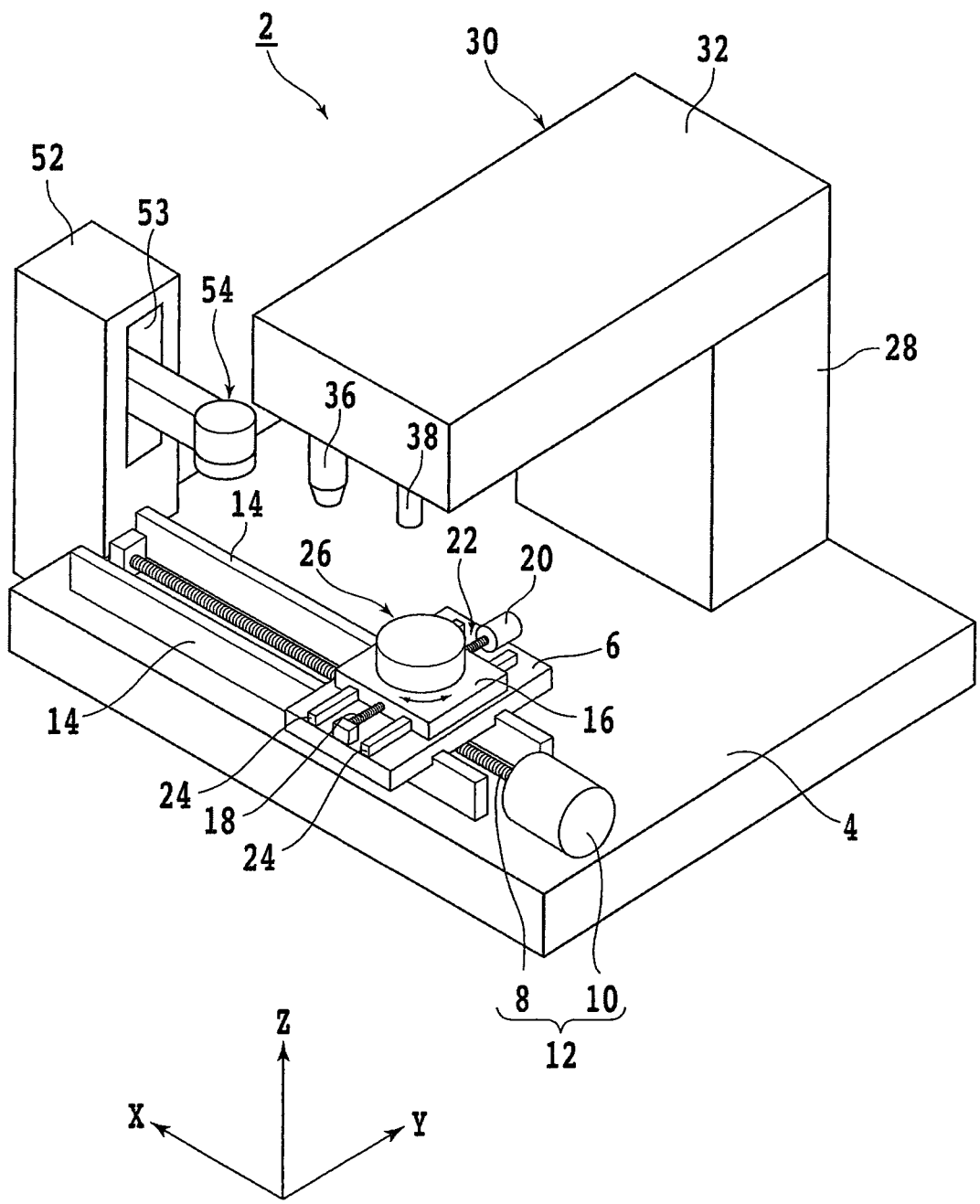
FIG. 1 is a perspective view of a laser processing apparatus suitable for use in performing a wafer producing method of the present invention.

A preferred embodiment of the present invention will now be described in detail with reference to the drawings. Referring to FIG. 1, there is shown a perspective view of a laser processing apparatus 2 suitable for use in performing a wafer producing method of the present invention. The laser processing apparatus 2 includes a stationary base 4 and a first slide block 6 mounted on the stationary base 4 so as to be movable in the X direction. The first slide block 6 is moved in a feeding direction, or in the X direction along a pair of guide rails 14 by a feeding mechanism 12 composed of a ball screw 8 and a pulse motor 10.

A second slide block 16 is mounted on the first slide block 6 so as to be movable in the Y direction. The second slide block 16 is moved in an indexing direction, or in the Y direction along a pair of guide rails 24 by an indexing mechanism 22 composed of a ball screw 18 and a pulse motor 20. A support table 26 is mounted on the second slide block 16. The support table 26 is movable in the X direction and the Y direction by the feeding mechanism 12 and the indexing mechanism 22 and also rotatable by a motor stored in the second slide block 16.

A column 28 is provided on the stationary base 4 so as to project upward therefrom. A laser beam applying mechanism (laser beam applying means) 30 is mounted on the column 28. The laser beam applying mechanism 30 is composed of a casing 32, a laser beam generating unit 34 (see FIG. 2) stored in the casing 32, and focusing means (laser head) 36 mounted on the front end of the casing 32. An imaging unit 38 having a microscope and a camera is also mounted on the front end of the casing 32 so as to be aligned with the focusing means 36 in the X direction. The focusing means 36 is mounted on the casing 32 so as to be slightly movable in a vertical direction (Z direction).

As shown in FIG. 2, the laser beam generating unit 34 includes a laser oscillator 40 for generating a pulsed laser beam such as YAG laser and YVO4 laser, repetition frequency setting means 42 for setting the repetition frequency of the pulsed laser beam to be generated from the laser oscillator 40, pulse width adjusting means 44 for adjusting the pulse width of the pulsed laser beam to be generated from the laser oscillator 40, and power adjusting means 46 for adjusting the power of the pulsed laser beam generated from the laser oscillator 40. Although especially not shown, the laser oscillator 40 has a Brewster window, so that the laser beam generated from the laser oscillator 40 is a laser beam of linearly polarized light.

After the power of the pulsed laser beam is adjusted to a predetermined power by the power adjusting means 46 of the laser beam generating unit 34, the pulsed laser beam is reflected by a mirror 48 included in the focusing means 36 and next focused by a focusing lens 50 included in the focusing means 36. The focusing lens 50 is positioned so that the pulsed laser beam is focused inside an SiC ingot 11 as a workpiece fixed to the support table 26.

Figure 3A:
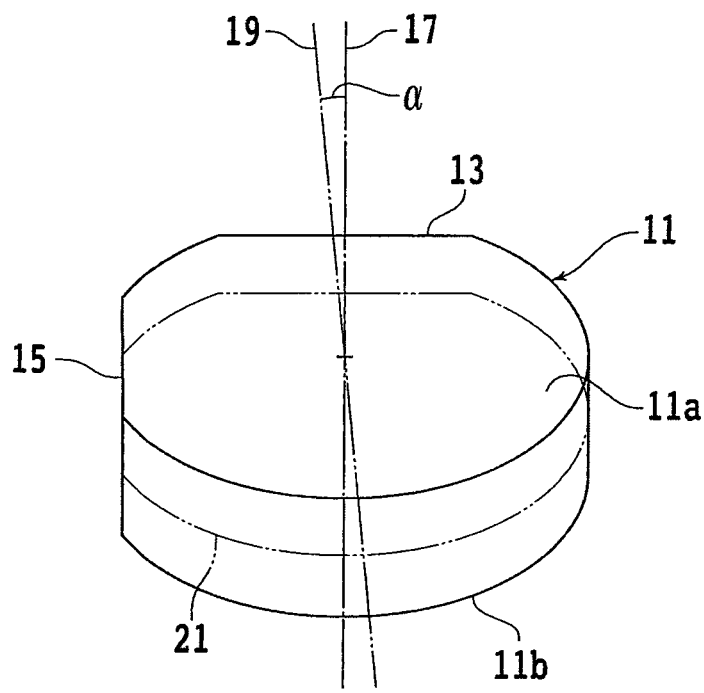
FIG. 3A is a perspective view of an SiC ingot.
Figure 3B:
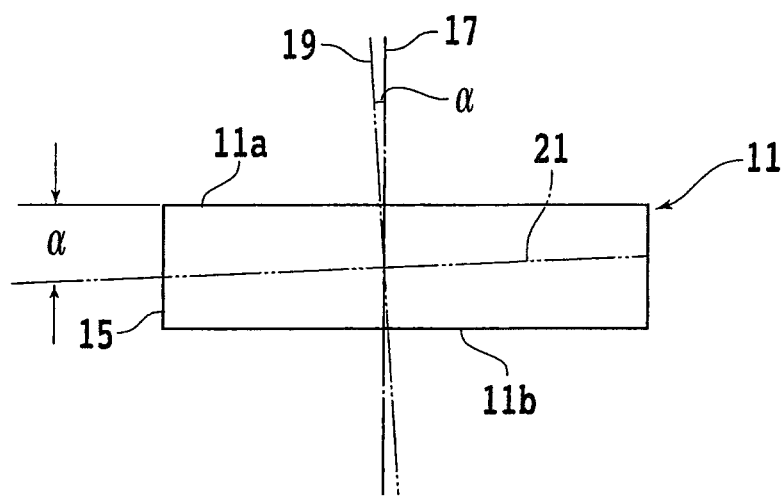
FIG. 3B is an elevational view of the SiC ingot shown in FIG. 3A.

Referring to FIG. 3A, there is shown a perspective view of the SiC ingot 11 as a workpiece to be processed. FIG. 3B is an elevational view of the SiC ingot (which will be hereinafter referred to also simply as ingot) 11 shown in FIG. 3A. The ingot 11 has a first surface (upper surface) 11a and a second surface (lower surface) 11b opposite to the first surface 11a. The upper surface 11a of the ingot 11 is preliminarily polished to a mirror finish because the laser beam is applied to the first surface 11a.

The ingot 11 has a first orientation flat 13 and a second orientation flat 15 perpendicular to the first orientation flat 13. The length of the first orientation flat 13 is set greater than the length of the second orientation flat 15. The ingot 11 has a c-axis 19 inclined by an off angle α toward the second orientation flat 15 with respect to a normal 17 to the upper surface 11a and also has a c-plane 21 perpendicular to the c-axis 19. The c-plane 21 is inclined by the off angle α with respect to the upper surface 11a. In general, in the SiC ingot 11, the direction perpendicular to the direction of extension of the shorter second orientation flat 15 is the direction of inclination of the c-axis 19.

The c-plane 21 is set in the ingot 11 innumerably at the molecular level of the ingot 11. In this preferred embodiment, the off angle α is set to 4°. However, the off angle α is not limited to 4° in the present invention. For example, the off angle α may be freely set in the range of 1° to 6° in manufacturing the ingot 11.

Referring again to FIG. 1, a column 52 is fixed to the left side of the stationary base 4. The column 52 is formed with a vertically elongated opening 53, and a pressing mechanism 54 is vertically movably mounted to the column 52 so as to project from the opening 53.

Figure 4:
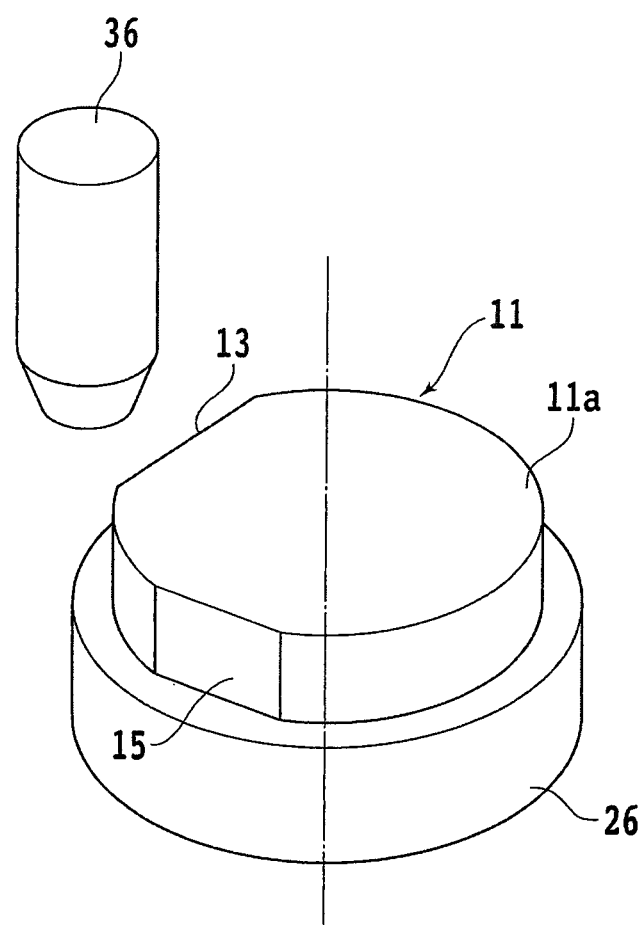
FIG. 4 is a perspective view for illustrating a modified layer forming step.
Figure 5:
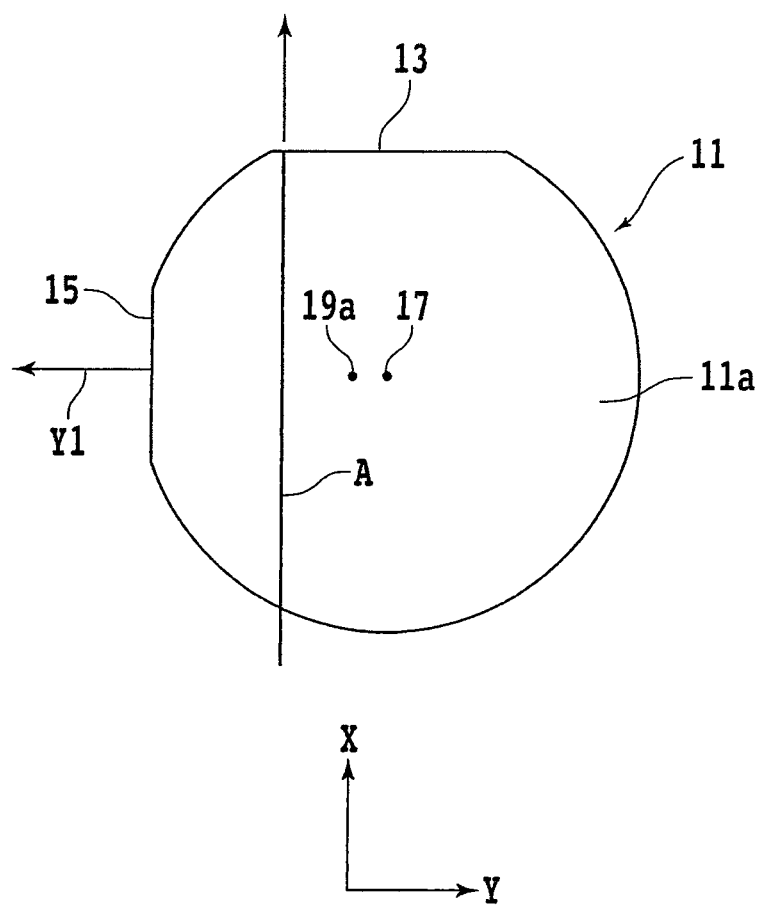
FIG. 5 is a plan view of the SiC ingot shown in FIG. 3A.

As shown in FIG. 4, the ingot 11 is fixed to the upper surface of the support table 26 by using a wax or adhesive in the condition where the second orientation flat 15 of the ingot 11 becomes parallel to the X direction. In other words, as shown in FIG. 5, the direction of formation of the off angle α is shown by an arrow Y1. That is, the direction of the arrow Y1 is the direction where the intersection 19a between the c-axis 19 and the upper surface 11a of the ingot 11 is present with respect to the normal 17 to the upper surface 11a. Further, the direction perpendicular to the direction of the arrow Y1 is shown by an arrow A. Then, the ingot 11 is fixed to the support table 26 in the condition where the direction of the arrow A becomes parallel to the X direction. Accordingly, the laser beam is scanned in the direction of the arrow A perpendicular to the direction of the arrow Y1, or the direction of formation of the off angle α. In other words, the direction of the arrow A perpendicular to the direction of the arrow Y1 where the off angle α is formed is defined as the feeding direction of the support table 26.

In the wafer producing method of the present invention, it is important that the scanning direction of the laser beam to be applied from the focusing means 36 is set to the direction of the arrow A perpendicular to the direction of the arrow Y1 where the off angle α of the ingot 11 is formed. That is, it was found that by setting the scanning direction of the laser beam to the direction of the arrow A as mentioned above in the wafer producing method of the present invention, cracks propagating from a modified layer formed inside the ingot 11 by the laser beam extend very long along the c-plane 21.

The following fact has already been found by the experiment made by the present inventor. That is, in applying a laser beam having a transmission wavelength to the SiC ingot 11 to thereby form a modified layer inside the ingot 11, the modified layer is well formed when the power density of the laser beam becomes 1.13 J/mm$^2$. The power density is defined as {average power/(spot area×repetition frequency)}.

Figure 6A:
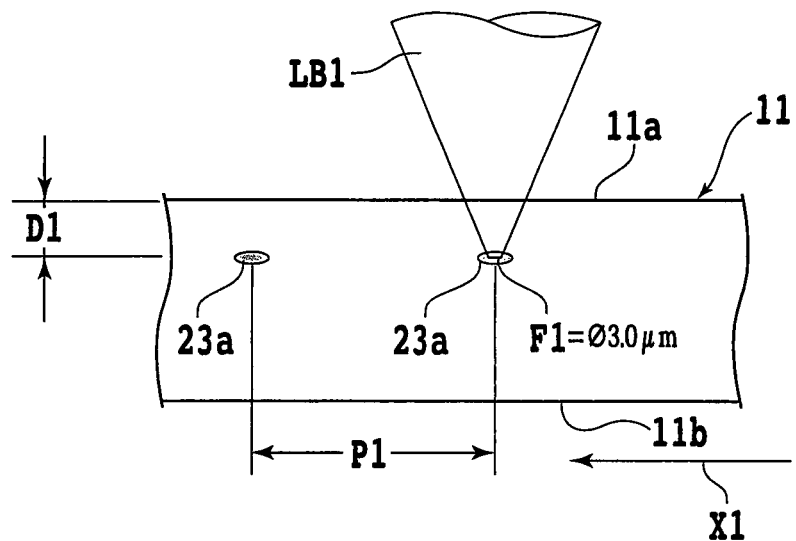
FIG. 6A is a schematic sectional view for illustrating a first modified layer forming step.

A feature of the wafer producing method according to the present invention is that a modified layer forming step is performed in such a manner that it is divided into a first modified layer forming step and a second modified layer forming step. As shown in FIG. 6A, the first modified layer forming step is performed in such a manner that a first laser beam LB1 having a first power (average power) is applied to the upper surface 11a of the SiC ingot 11 in the condition where the first focal point F1 of the first laser beam LB1 is set at a first depth D1 from the upper surface 11a, thereby forming a first modified layer 23a at the first depth D1 inside the ingot 11. By feeding the ingot 11 in the direction shown by an arrow X1 in FIG. 6A, a plurality of first modified layers 23a are discretely formed at the first depth D1 inside the ingot 11 due to multiphoton absorption.

In the first modified layer forming step, the repetition frequency, average power, and spot diameter of the first laser beam LB1 and the feed speed of the ingot 11 are optimally controlled to thereby discretely form the plural first modified layers 23a at the first depth D1 from the upper surface 11a of the ingot 11. For example, the first modified layer forming step is performed under the following processing conditions.

Light source: Nd:YAG pulsed laser
Wavelength: 1064 nm
Repetition frequency: 5 kHz
Average power: 0.125 W
Spot diameter: 3.0 μm (the diameter of a beam spot where each first modified layer 23a is formed is 3.0 μm)
Depth of the focal point: 70 μm from the first surface (upper surface) 11a
Power density: 1.13 J/mm$^2$
Index amount: 250 to 400 μm
Feed speed: 60 mm/second
Overlap rate: 0%

By performing the first modified layer forming step under the above processing conditions, the first depth D1 of the first focal point F1 is 70 μm, the spacing P1 between any adjacent ones of the plural first modified layers 23a is 12 μm, and the spot diameter at the first focal point F1 is 3.0 μm as shown in FIG. 6A.

The ingot 11 is indexed in the Y direction by the index amount of 250 to 400 μm, and the ingot 11 is fed in the X direction to thereby discretely form the plural first modified layers 23a at the first depth D1 of 70 μm from the upper surface 11a of the ingot 11. Thus, the first modified layer forming step is performed over the entire area of the ingot 11. Thereafter, the average power, repetition frequency, and focal position of the first laser beam LB1 are changed to next perform the second modified layer forming step.

The second modified layer forming step will now be described with reference to FIG. 6B. In the second modified layer forming step, a second laser beam LB2 having a transmission wavelength to the ingot 11 and a second power greater than the first power is used. The second focal point F2 of the second laser beam LB2 is set at a second depth D2 greater than the first depth D1 from the first surface (upper surface) 11a of the ingot 11 in such a manner that a beam spot of the second laser beam LB2 overlaps any one of the plural first modified layers 23a at the first depth D1. In this condition, the second laser beam LB2 is applied to the first surface (upper surface) 11a of the ingot 11 as feeding the ingot 11 in the direction shown by an arrow X1 in FIG. 6B.

The repetition frequency and average power of the second laser beam LB2 and the feed speed of the ingot 11 are optimally controlled so that the power density of the second laser beam LB2 at the first depth D1 becomes 1.13 J/mm$^2$. As a result, the first modified layers 23a function to start the occurrence of multiphoton absorption in applying the second laser beam LB2 to the ingot 11, so that a plurality of second modified layers 23 parallel to the upper surface 11a are continuously formed at the first depth D1 so as to be overlapped with each other. Further, cracks 25 (see FIG. 7) can be formed so as to extend from the continuous second modified layers 23 along the c-plane.

For example, the second modified layer forming step is performed under the following processing conditions.

Light source: Nd:YAG pulsed laser
Wavelength: 1064 nm
Repetition frequency: 60 kHz
Average power: 1.5 W
Spot diameter: 3.0 μm (the diameter of a beam spot where each second modified layer 23 is formed is 5.3 μm)
Depth of the focal point: 80 μm from the first surface (upper surface) 11a
Power density: 3.53 J/mm$^2$
Index amount: 250 to 400 μm
Feed speed: 60 mm/second
Overlap rate: 80%

Figure 6B:
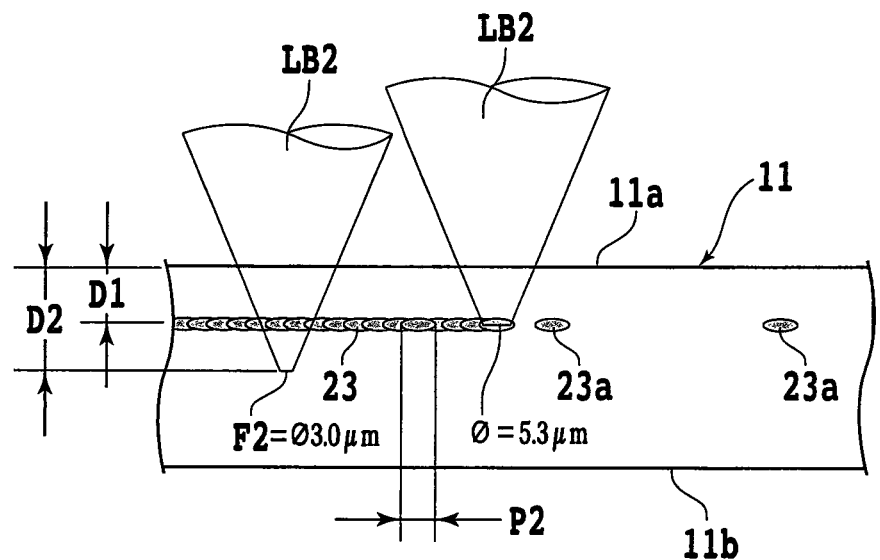
FIG. 6B is a schematic sectional view for illustrating a second modified layer forming step.

By performing the second modified layer forming step under the above processing conditions, the second depth D2 of the second focal point F2 is 80 μm, the spot diameter at the second focal point F2 is 3.0 μm, the spot diameter at the first depth D1 is 5.3 μm, the power density at the first depth D1 is 1.13 J/mm$^2$, and the spacing P2 between any adjacent ones of the plural second modified layers 23 overlapped with each other is 1 μm as shown in FIG. 6B.

Figure 7:
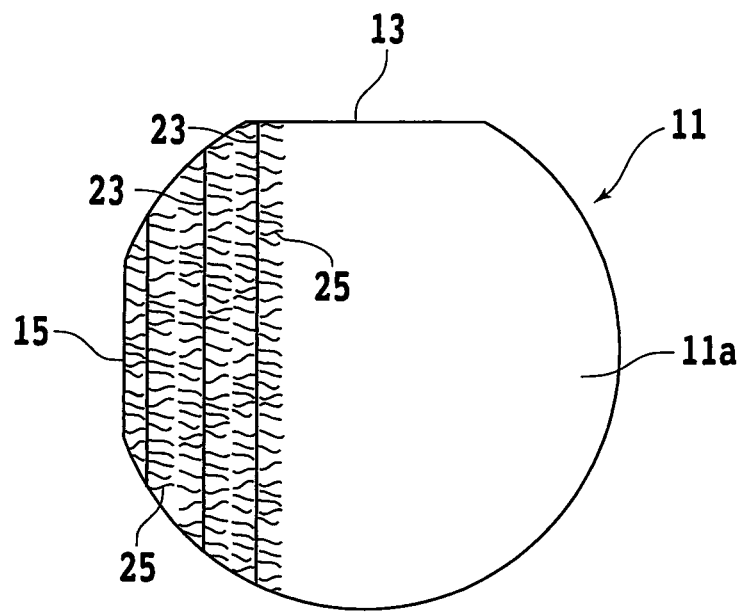
FIG. 7 is a schematic plan view for illustrating the second modified layer forming step.

As shown in FIG. 7, a line of the continuous second modified layers 23 is linearly formed so as to extend in the X direction, so that the cracks 25 propagate from the line of the continuous second modified layers 23 in opposite directions along the c-plane 21. In the second modified layer forming step according to this preferred embodiment, the width of the cracks 25 formed on one side of the line of the continuous second modified layers 23 along the c-plane 21 is measured, and the index amount of the second focal point F2 in relatively indexing the second focal point F2 in the Y direction by the predetermined amount is set according to the width measured above. Preferably, this index amount is set to 250 to 400 μm.

Thereafter, as shown in FIG. 7, the ingot 11 is sequentially indexed in the Y direction by the predetermined amount to form a plurality of parallel lines of the continuous second modified layers 23 at the first depth D1 in the whole area of the ingot 11, wherein each line of the continuous second modified layers 23 is parallel to the first surface (upper surface) 11a of the ingot 11. At the same time, the cracks 25 are formed on both sides of each line of the continuous second modified layers 23 so as to extend along the c-plane 21.

Figure 8A:
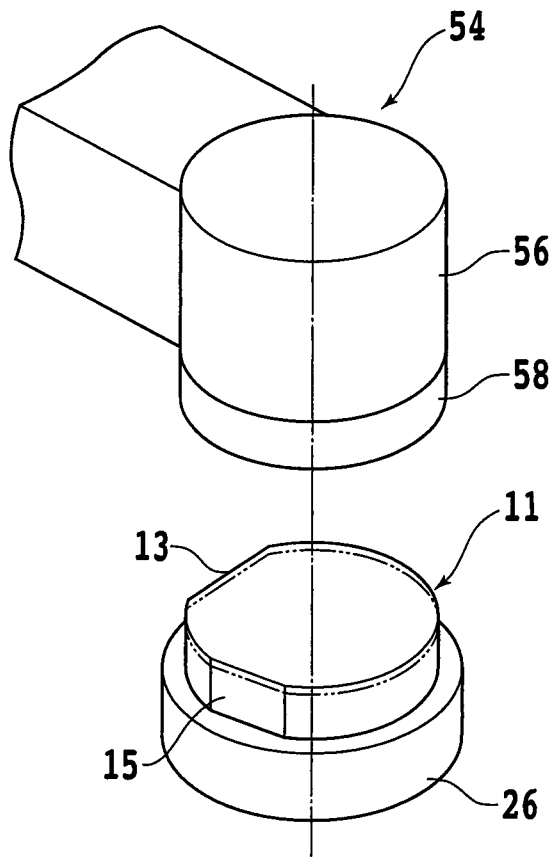
FIGS. 8A and 8B are perspective views for illustrating a wafer separating step.
Figure 8B:
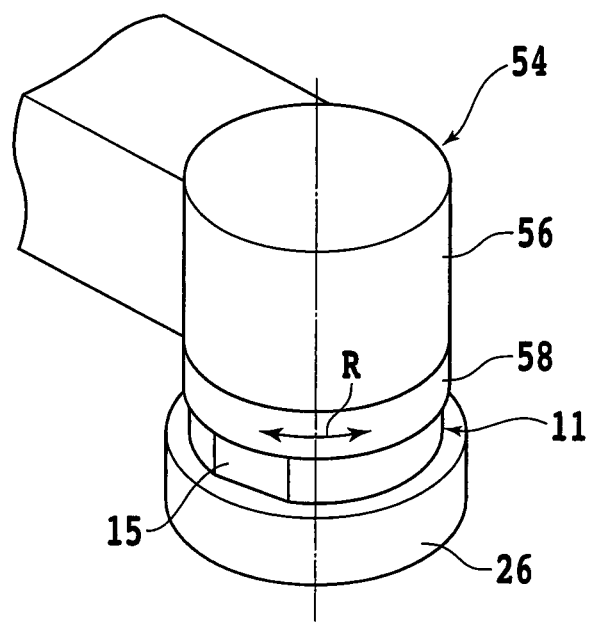
Figure 9:
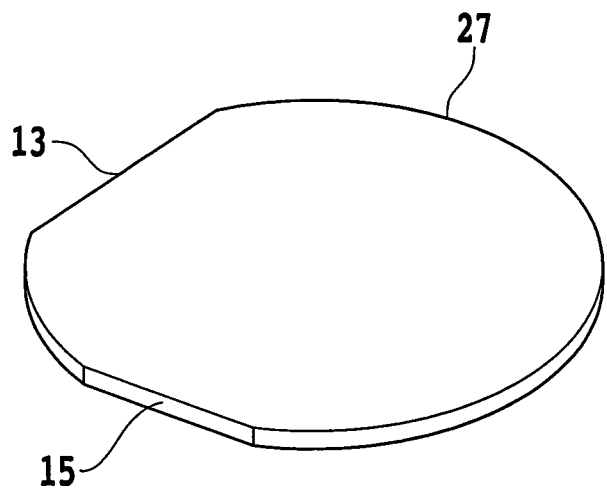
FIG. 9 is a perspective view of an SiC wafer produced from the SiC ingot.

A plurality of modified layers 23 at the first depth D1 in the whole area of the ingot 11 and the cracks 25 extending from each modified layer 23 along the c-plane 21 are formed. Thereafter, a wafer separating step is performed in such a manner that an external force is applied to the SiC ingot 11 to thereby separate a plate-shaped member having a thickness corresponding to the thickness of the wafer to be formed from the SiC ingot 11 at the separation start point composed of the second modified layers 23 and the cracks 25, thus producing an SiC wafer 27 shown in FIG. 9. This wafer separating step is performed by using the pressing mechanism 54 shown in FIG. 1. The configuration of the pressing mechanism 54 is shown in FIGS. 8A and 8B. The pressing mechanism 54 includes a head 56 vertically movable by a moving mechanism (not shown) incorporated in the column 52 shown in FIG. 1 and a pressing member 58 rotatable in the direction shown by an arrow R in FIG. 8B with respect to the head 56.

As shown in FIG. 8A, the pressing mechanism 54 is relatively positioned above the ingot 11 fixed to the support table 26. Thereafter, as shown in FIG. 8B, the head 56 is lowered until the pressing member 58 comes into pressure contact with the upper surface 11a of the ingot 11. In the condition where the pressing member 58 is in pressure contact with the upper surface 11a of the ingot 11, the pressing member 58 is rotated in the direction of the arrow R to thereby generate a torsional stress in the ingot 11. As a result, the ingot 11 is broken at the separation start point where the second modified layers 23 and the cracks 25 are formed. Accordingly, the SiC wafer 27 shown in FIG. 9 can be separated from the SiC ingot 11. After separating the wafer 27 from the ingot 11, the separation surface of the wafer 27 and the separation surface of the ingot 11 are preferably polished to a mirror finish.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing method for producing an SiC wafer from an SiC ingot having a first surface, a second surface opposite to said first surface, a c-axis extending from said first surface to said second surface, and a c-plane perpendicular to said c-axis, said wafer producing method comprising:

a first modified layer forming step of setting the focal point of a first laser beam having a transmission wavelength to said SiC ingot and a first power, inside said SiC ingot at a first depth from said first surface, said first depth corresponding to the thickness of said SiC wafer to be produced, and next applying said first laser beam to said first surface as relatively moving the focal point of said first laser beam in a first direction perpendicular to a second direction where said c-axis is inclined by an off angle with respect to a normal to said first surface and said off angle is formed between said first surface and said c-plane, thereby discretely forming a plurality of first modified layers parallel to said first surface at said first depth, said first modified layers being spaced from each other in said first direction;

a first indexing step of relatively moving the focal point of said first laser beam in said second direction to thereby index the focal point of said first laser beam by a predetermined amount;

a second modified layer forming step of setting the focal point of a second laser beam having a transmission wavelength to said SiC ingot and a second power greater than said first power, inside said SiC ingot at a second depth greater than said first depth from said first surface in such a manner that a beam spot of said second laser beam overlaps any one of said first modified layers at said first depth, after performing said first modified layer forming step and said first indexing step, and next applying said second laser beam to said first surface as relatively moving the focal point of said second laser beam in said first direction, thereby continuously forming a plurality of second modified layers parallel to said first surface at said first depth, said second modified layers being overlapped with each other to form a straight line extending in said first direction, and also forming cracks on both sides of said straight line so as to extend along said c-plane;

a second indexing step of relatively moving the focal point of said second laser beam in said second direction to thereby index the focal point of said second laser beam by said predetermined amount; and a wafer separating step of separating a plate-shaped member having a thickness corresponding to the thickness of said SiC wafer from said SiC ingot at a separation start point composed of said second modified layers and said cracks after performing said second modified layer forming step and said second indexing step, thus producing said SiC wafer from said SiC ingot.

\* \* \* \* \*